United States Patent
Chiu et al.

(10) Patent No.: US 7,123,077 B2
(45) Date of Patent: Oct. 17, 2006

(54) FOUR-PHASE CHARGE PUMP CIRCUIT WITH REDUCED BODY EFFECT

(75) Inventors: Liang-Hsiang Chiu, Taoyuan Hsien (TW); Wu-Chang Chang, Peipu Hsiang (TW)

(73) Assignee: Ememory Technology Inc., Hsinchu (TW)

( * ) Notice: Subject to any disclaimer, the term of this patent is extended or adjusted under 35 U.S.C. 154(b) by 122 days.

(21) Appl. No.: 10/947,677

(22) Filed: Sep. 23, 2004

(65) Prior Publication Data

US 2006/0061410 A1    Mar. 23, 2006

(51) Int. Cl.
   *G05F 1/10*    (2006.01)
(52) U.S. Cl. .......................... 327/536; 363/60
(58) Field of Classification Search ........ 327/535–537; 363/60
   See application file for complete search history.

(56) References Cited

U.S. PATENT DOCUMENTS

| | | | | |
|---|---|---|---|---|
| 4,935,644 A | * | 6/1990 | Tsujimoto | 327/536 |
| 5,644,534 A | * | 7/1997 | Soejima | 365/185.23 |
| 5,712,778 A | * | 1/1998 | Moon | 363/60 |
| 5,767,733 A | * | 6/1998 | Grugett | 327/534 |
| 5,767,735 A | * | 6/1998 | Javanifard et al. | 327/536 |
| 6,037,622 A | * | 3/2000 | Lin et al. | 257/299 |
| 6,452,438 B1 | * | 9/2002 | Li | 327/536 |
| 6,605,984 B1 | * | 8/2003 | Annavajjhala et al. | 327/536 |
| 6,677,806 B1 | * | 1/2004 | Bloch | 327/536 |
| 6,878,981 B1 | * | 4/2005 | Eshel | 257/299 |
| 2002/0101744 A1 | * | 8/2002 | DeMone | 363/59 |
| 2002/0118059 A1 | * | 8/2002 | Ido | 327/536 |
| 2005/0151580 A1 | * | 7/2005 | Lin et al. | 327/536 |

* cited by examiner

*Primary Examiner*—Linh My Nguyen
*Assistant Examiner*—Thomas J Hiltunen
(74) *Attorney, Agent, or Firm*—Alan D. Kamrath; Nikolai & Mersereau, P.A.

(57) ABSTRACT

A charge pump circuit has an input stage, an output stage and multiple boosting stages coupled between the input stage and the output stage. The boosting stages are driven by four phase clock signals. Each boosting stage has two branch charge pumps, wherein each branch charge pump at least has a main pass transistor, a pre-charge transistor, two substrate transistors and capacitors. The substrate transistors and the main pass transistor are operated in association with the four phase clock signals to keep a potential of the body of the main pass transistors at a low level thus mitigating the body effect.

6 Claims, 14 Drawing Sheets

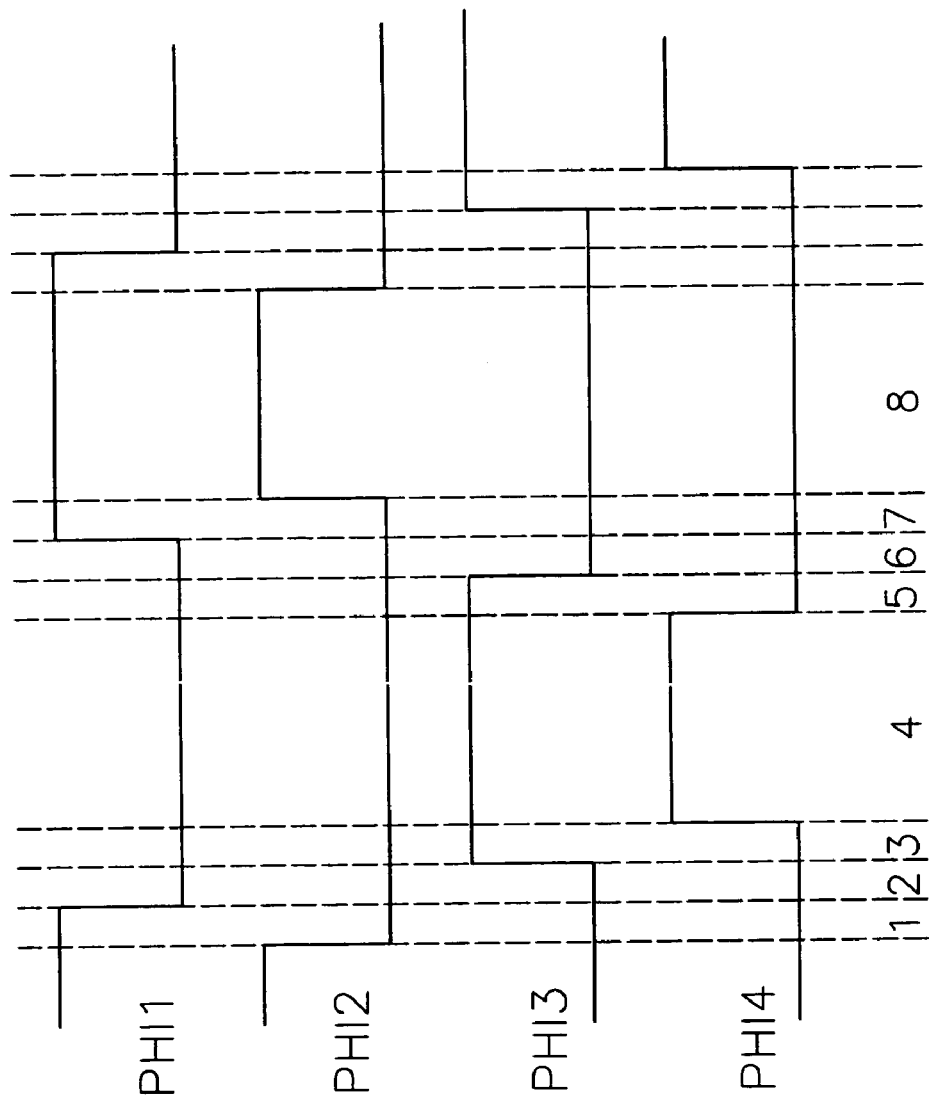

FOUR-PHASE CHARGE PUMP CIRCUIT WITH REDUCED BODY EFFECT

BACKGROUND OF THE INVENTION

1. Field of the Invention

The present invention relates to a charge pump circuit, and more particularly to a charge pump circuit that effectively prevents an occurrence of a body effect of metal oxide semiconductor field-effect transistors (MOSFETs).

2. Description of Related Art

In order to lower power consumption, an operating voltage for integrated circuits (ICs) is modified to a lower level. For example, the normal operating voltage for the ICs has been changed from the early 5 volts to the present 3.3 volts, and sometimes even lower than 2 volts. Although a lower operating voltage is beneficial for power consumption reduction, some particular applications requiring a high operating voltage still should be concerned. In particular, while erasing data stored in a flash memory, a large negative voltage, usually −9 or −10 volts, is necessary and supplied by a charge pump circuit.

A conventional negative voltage charge pump circuit is disclosed in FIG. 7. The negative voltage charge pump comprises eight boosting stages (only four stages are shown) and an output stage. Each boosting stage has a P-channel type main pass transistor (301)-(301) connected to an adjacent transistor in series, a P-channel type pre-charge transistor (331)-(334) and two capacitors (311)-(314) and (321)-(324). All the boosting stages are driven by four clock signals (CLK1–CLK4).

The clock signals CLK1 and CLK4 firstly remain at a low level to respectively activate the main pass transistor (301) in the first boosting stage and the pre-charge transistor (332) in the second boosting stage. Then, the clock signal CLK1 turns to a high level to deactivate the main pass transistor (301) in the first boosting stage. Simultaneously, the clock signal CLK2 becomes a low level signal thus conducting the pre-charge transistor (331) and resulting in a discharge of the capacitor (311). The capacitor (321) subsequently has a −VCC potential and the main pass transistor (301) is deactivated. The clock signal CLK2 still continuously charges the capacitor (312) until the CLK4 signal becomes a high level signal to deactivate the pre-charge transistor (332).

Since the main pass transistor (302) of the second boosting stage has been charged to a negative potential prior to the activating of the pre-charge transistor (332), a voltage level at the gate of the main pass transistor (302) is lower than that of its source. Therefore, when the main pass transistor (302) is activated, the capacitor (322) can be quickly charged to −2×VCC. Using the foregoing technique, the input voltage can be gradually boosted by the boosting stages and a negative voltage is finally derived Vout=−((N×VCC)−Vt.

The foregoing circuit operation is also suitable for a positive voltage charge circuit as shown in FIG. 4 of Taiwan Patent no. 477977, wherein the N-channel type transistors are employed to replace the P-channel transistors of FIG. 3 and the clock signals are also accordingly modified.

As discussed above, the charge pump circuits have been widely used. However, some deficiencies of the conventional charge pump circuits still exist.

As well known in the art, a parasitic bipolar transistor exists between an N-type well region and a P-type well region of an N-channel type MOSFET. When the parasitical bipolar transistor is turned on, a voltage across the body and the source of the parasitical bipolar transistor itself is not zero, which will affect the threshold voltage of the N-channel type MOSFET the so-called body effect. Therefore, when a charge pump circuit utilizes the N-channel type MOSFETs as the main pass transistors, the N-channel type MOSFETs can not be quickly activated thus causing an undesired delay result in the flowing of the charge current through the boosting stages. The efficiency of the charge pump circuit will accordingly be negatively influenced.

Therefore, the invention provides a novel charge pump circuit to mitigate or obviate the aforementioned problem.

SUMMARY OF THE INVENTION

The main objective of the present invention is to provide a charge pump circuit that prevents the occurrence of the body effect, whereby the efficiency of the circuit is enhanced. To accomplish the objective, the charge pump circuit comprises:

an input stage;

an output stage, which outputs a boosted voltage;

multiple boosting stages, which are coupled between the input stage and the output stage and driven by four phase clock signals; each boosting stage comprising an upper branch charge pump and a lower branch charge pump, each branch charge pump further having a main pass transistor with a body, a pre-charge transistor, two substrate transistors and two capacitors, wherein the body of the main transistor is coupled to the two substrate transistors, and a potential of the body is kept at a low level by a control of the four phase clock signals.

Other objectives, advantages and novel features of the invention will become more apparent from the following detailed description when taken in conjunction with the accompanying drawings.

BRIEF DESCRIPTION OF THE DRAWINGS

FIG. 2 shows waveforms of four phase clock signals applied for the circuit of FIG. 1 in accordance with the present invention;

DETAILED DESCRIPTION OF THE PREFERRED EMBODIMENT

Figure 1:
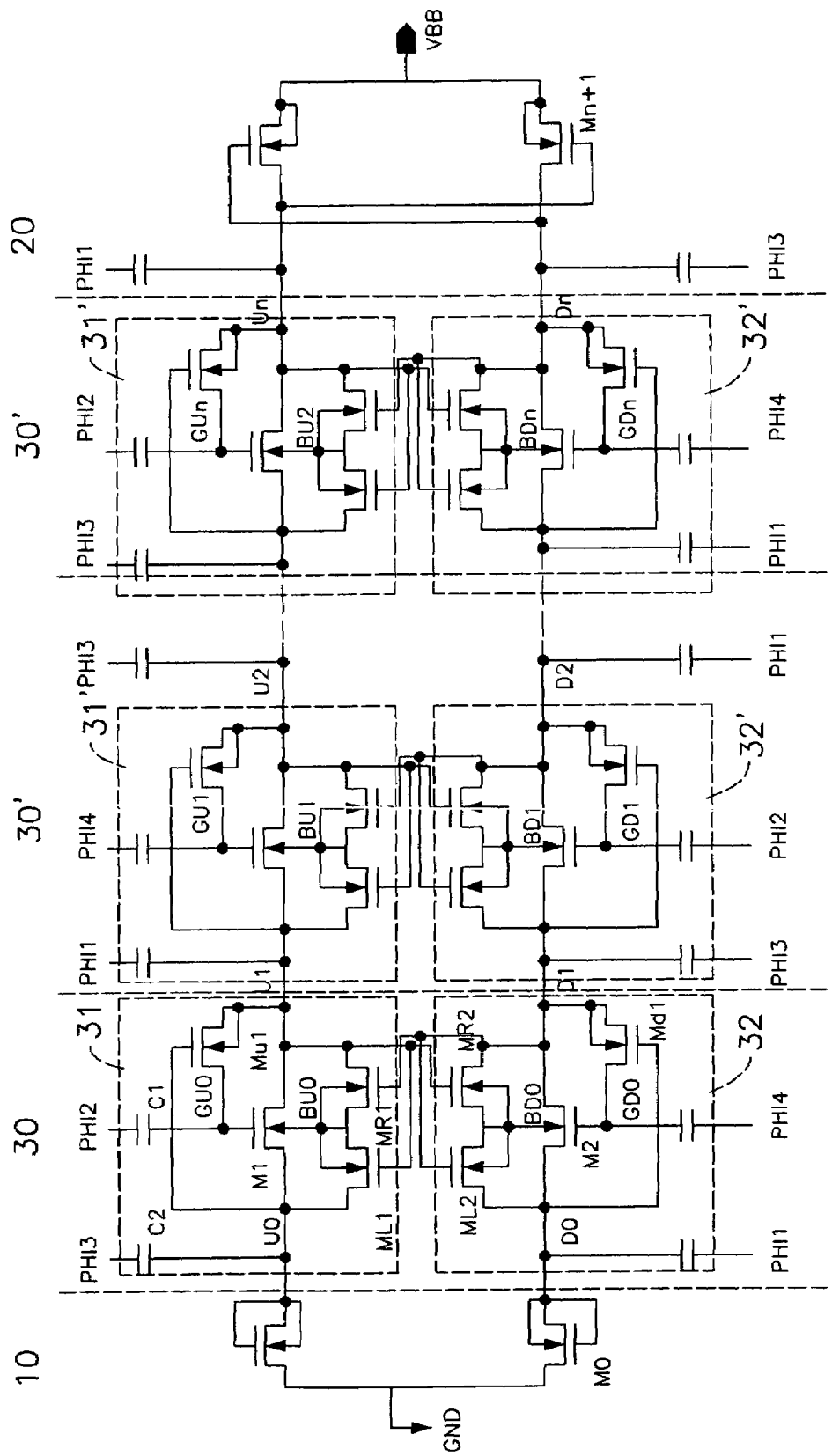
FIG. 1 is a circuit diagram according to a first embodiment of the present invention.

With reference to FIG. 1, a negative voltage charge pump circuit in accordance with the present invention comprises an input stage (10), an output stage (20), and multiple boosting stages (30)(30') coupled between the input stage (10) and the output stage (20).

Each boosting stage (30)(30') has an upper branch charge pump (31)(31') and a lower branch charge pump (32)(32'). Using the first boosting stage (30) as an example, the upper branch charge pump (31) comprises a main pass transistor M1, a pre-charge transistor Mu1, two capacitors C1, C2 and two substrate transistors ML1, MR1.

The main pass transistor M1 has a body, a gate terminal, a source terminal and a drain terminal. The source terminal and the drain terminal are respectively used as a first node U0 and a second node U1, and are respectively coupled to a front stage (the input stage (10) in the example) and a rear stage (the second boosting stage (30')). The pre-charge transistor Mul provides its source terminal and drain terminal to respectively couple to the gate terminal of the main pass transistor M1 and the second node U1. A gate terminal of the pre-charge transistor Mul is connected to the first node U0 of the main pass transistor M1.

The two capacitors C1 and C2 are respectively coupled to the gate terminal of the main pass transistor M1 and the first node U0.

Both the substrate transistors ML1 and MR1 have a gate terminal, a source terminal and a drain terminal. Their source terminals and bodies are connected together and further coupled to the body of the main pass transistor M1. The drain terminals of the substrate transistors ML1 and MR1 are respectively connected to the first node U0 and the second node U1 of the main pass transistor M1. The gate of one substrate transistor ML1 is connected to the second node U1 of the main pass transistor M1, and the gate of the other substrate transistor MR1 is connected to a second node D1 of the lower branch charge pump (32).

The main pass transistor M1, the pre-charge transistor Mu1 and the substrate transistors ML1, MR1 mentioned above are all N-channel MOSFETs.

The components of the lower branch charge bump (32) are the same as the upper branch charge pump (31), wherein a gate terminal of a substrate transistor MR2 is connected to the second node U1 of the upper branch charge pump (31).

With reference to FIGS. 2–3, the upper branch charge pumps (31)(31') and lower branch charge pumps (32)(32') are driven by four clock signals PHI1–PHI4 to perform voltage boosting stage by stage. The main pass transistors M1, M2 in accompaniment with the substrate transistors MR1, MR2, ML1 and ML2 performs a bias switching operation to keep the bias of the main pass transistors M1 and M2 at a low potential level thus mitigating the body effect.

In the following circuit description, the operation of the first boosting stage (30) is divided into several time slots.

Figure 3A:
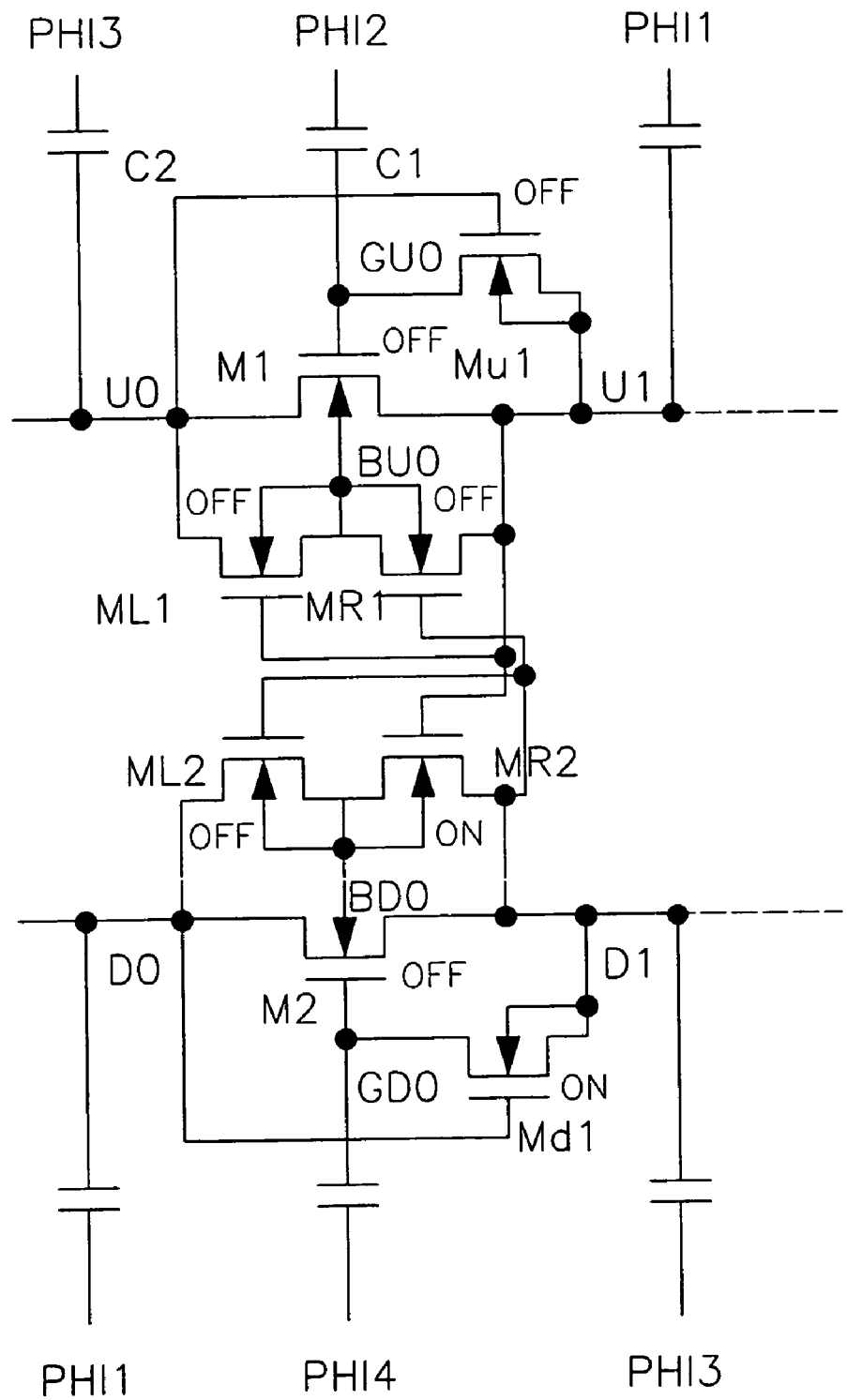
FIGS. 3A–3H show circuit operations in different time slots in accordance with the present invention.

The first time slot: with reference to FIG. 3A, the phase clock signal PHI1 is a high level potential and the remaining phase clock signals PHI2, PHI3 and PHI4 are all at the low level. Therefore, the substrate transistor MR2 in the lower branch pump circuit (32) of the first boosting stage (30) is turned on, whereby the potential level at the body of the main pass transistor M2 is charged to the low potential level. Further, the pre-charge transistor Mdl is conducted to prevent a charge to the previous stage. Since the phase clock signals PHI2 and PHI4 are all at the low level, the main pass transistors M1 and M2 in the upper/lower branch charge pumps (31)(32) are simultaneously turned off.

Figure 3B:
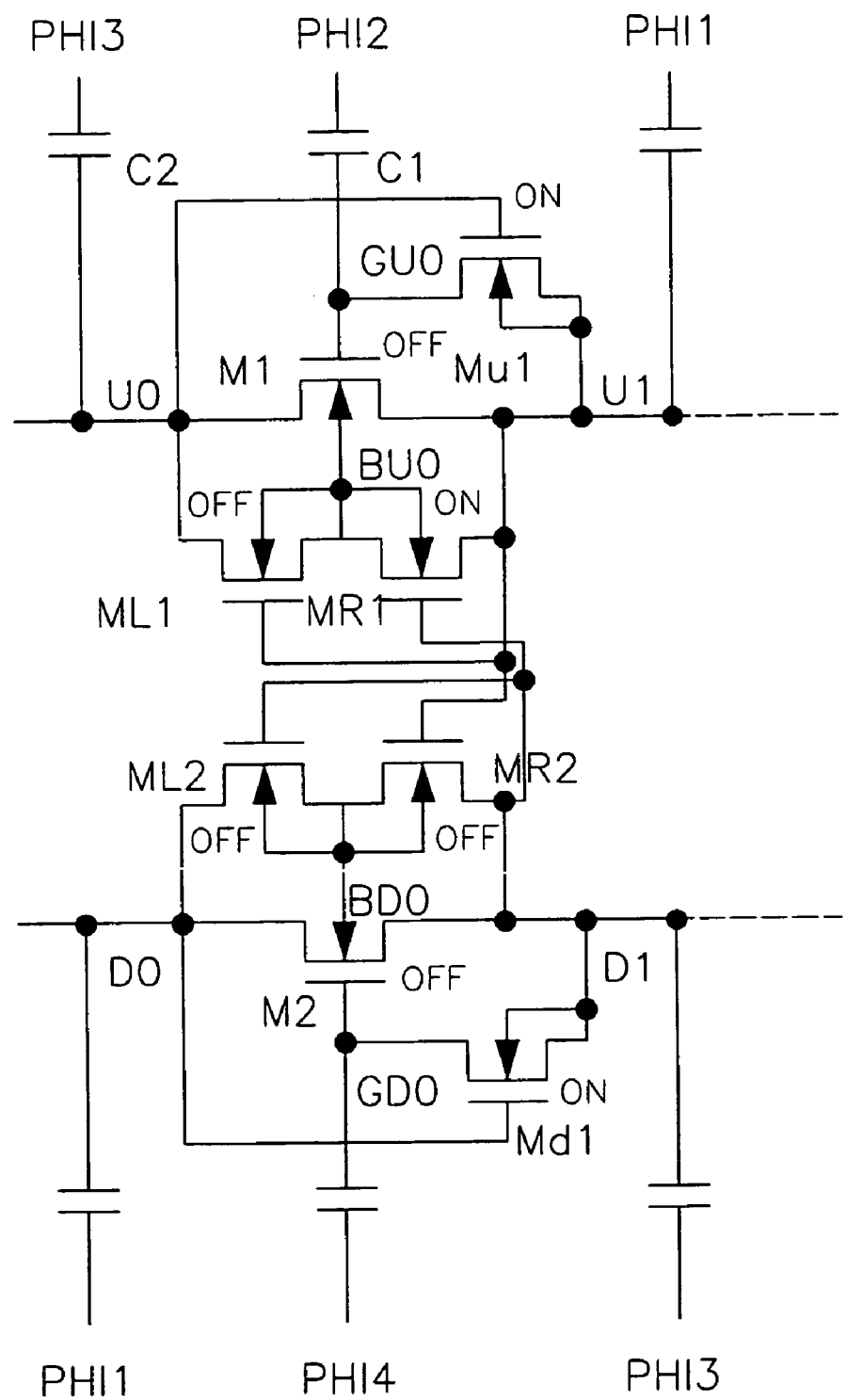

The second time slot: with reference to FIG. 3B, the phase clock signal PHI 1 is changed to a low level so as to turn off substrate transistor (MR2), and the pre-charge transistor (Mul) is turned off. The first node D0 of the lower branch charge pump (32) is coupled to a low potential level.

Figure 3C:
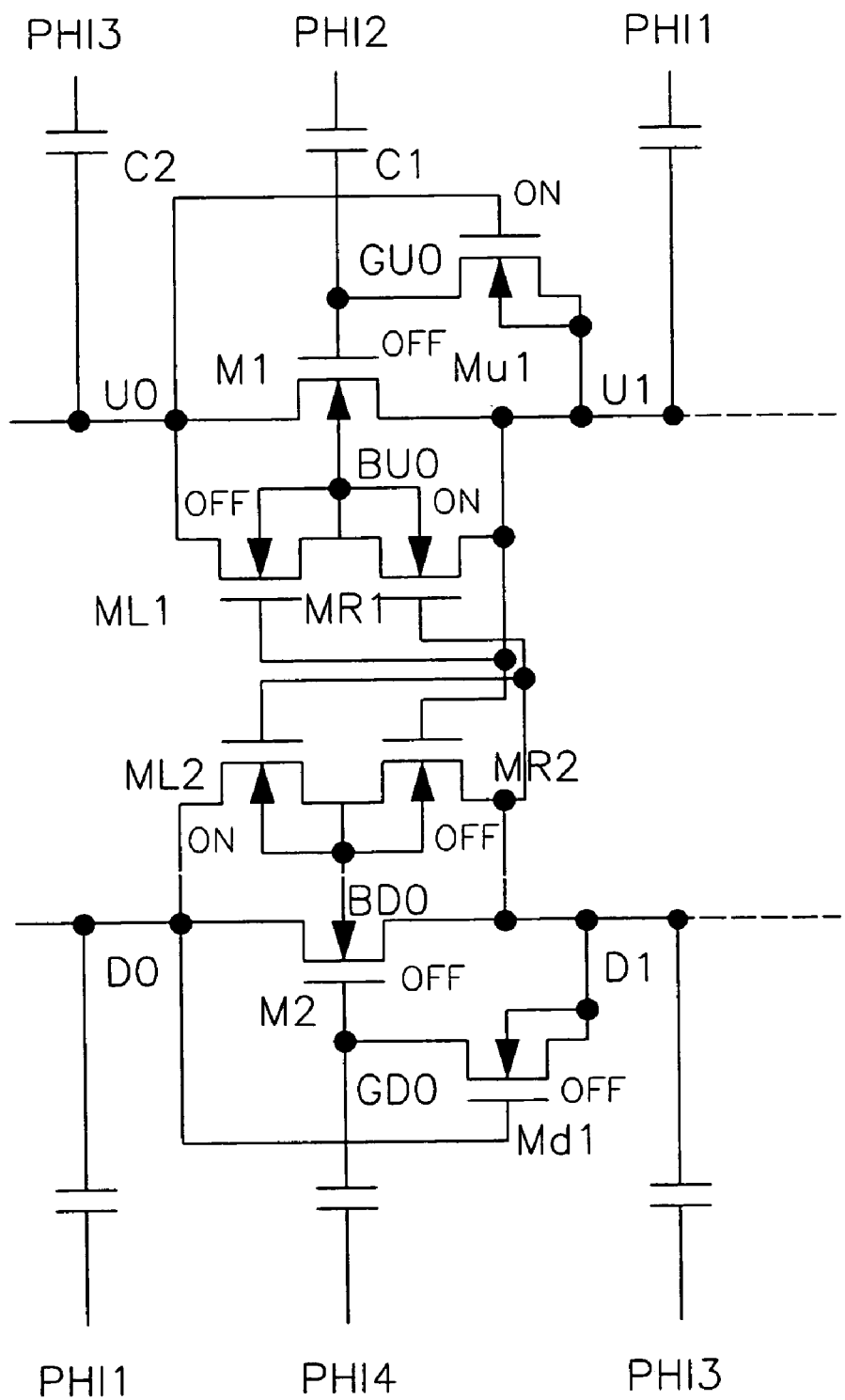

The third time slot: with reference to FIG. 3C, the phase clock signal PHI3 becomes a high level signal and the second node D1 of the lower branch charge pump (32) is coupled to a high potential level. Therefore, the parasitic bipolar transistor existing at the PN junction of the pre-charge transistor Mdl is turned on. A forward bias will pre-charge the gate node GD0 of the main pass transistor M2. Meanwhile, the substrate transistor ML2 will be turned on. Before the main pass transistor M2 becomes conducted, the potential level across the body to source (Vbs=0) becomes zero thus the body effect of the main pass transistor M2 is effectively reduced.

Figure 3D:
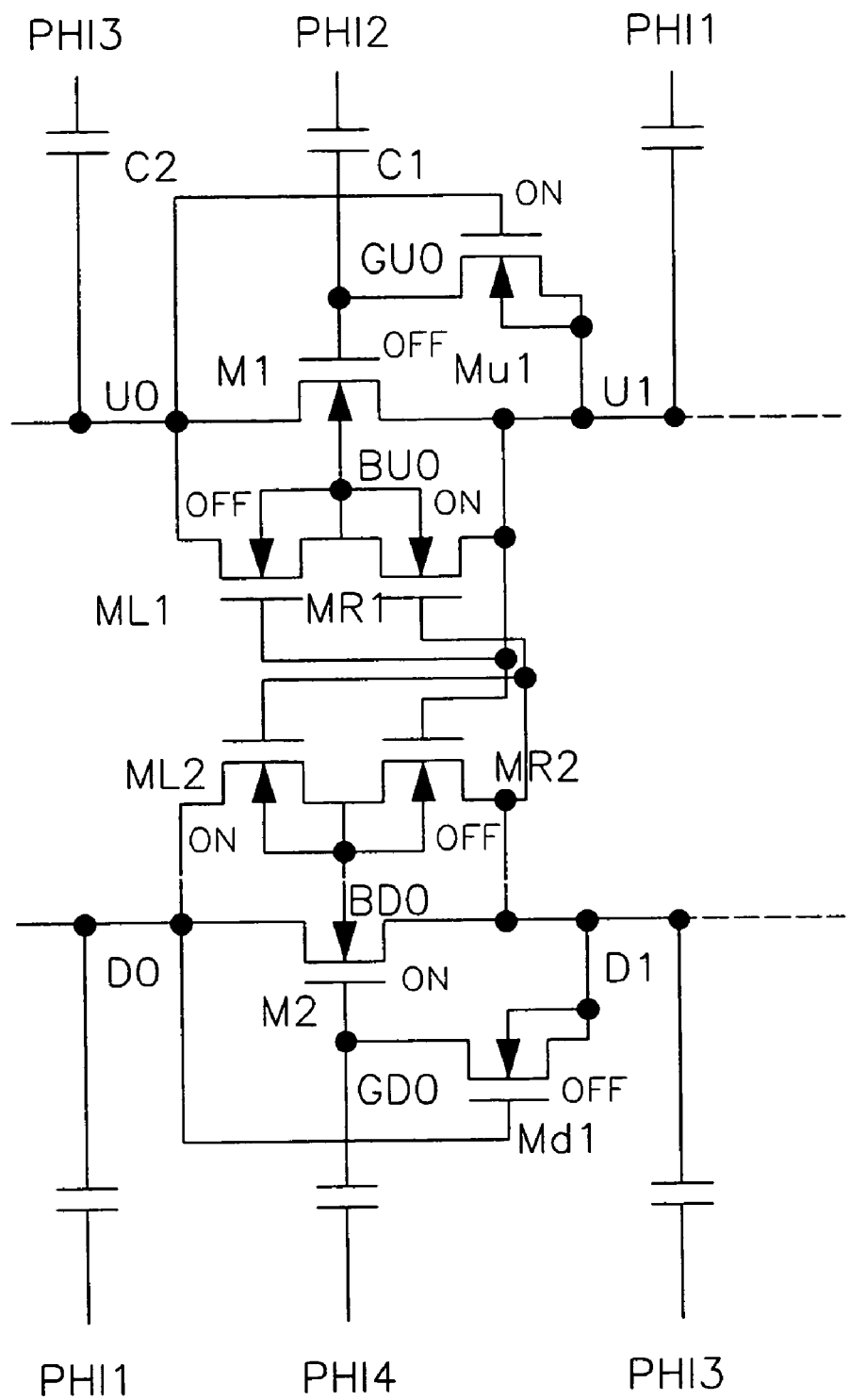

The fourth time slot: with reference to FIG. 3D, the phase clock signal PHI4 becomes a high level signal to turn on the main pass transistor M2, wherein a current flows through the lower branch charge pump to charge the next boosting stage. When the voltage Vgs of the substrate transistor ML2 is lower than the threshold voltage Vtn, the substrate transistor ML2 is turned off, and the body of the main pass transistor M2 is floating.

Figure 3E:
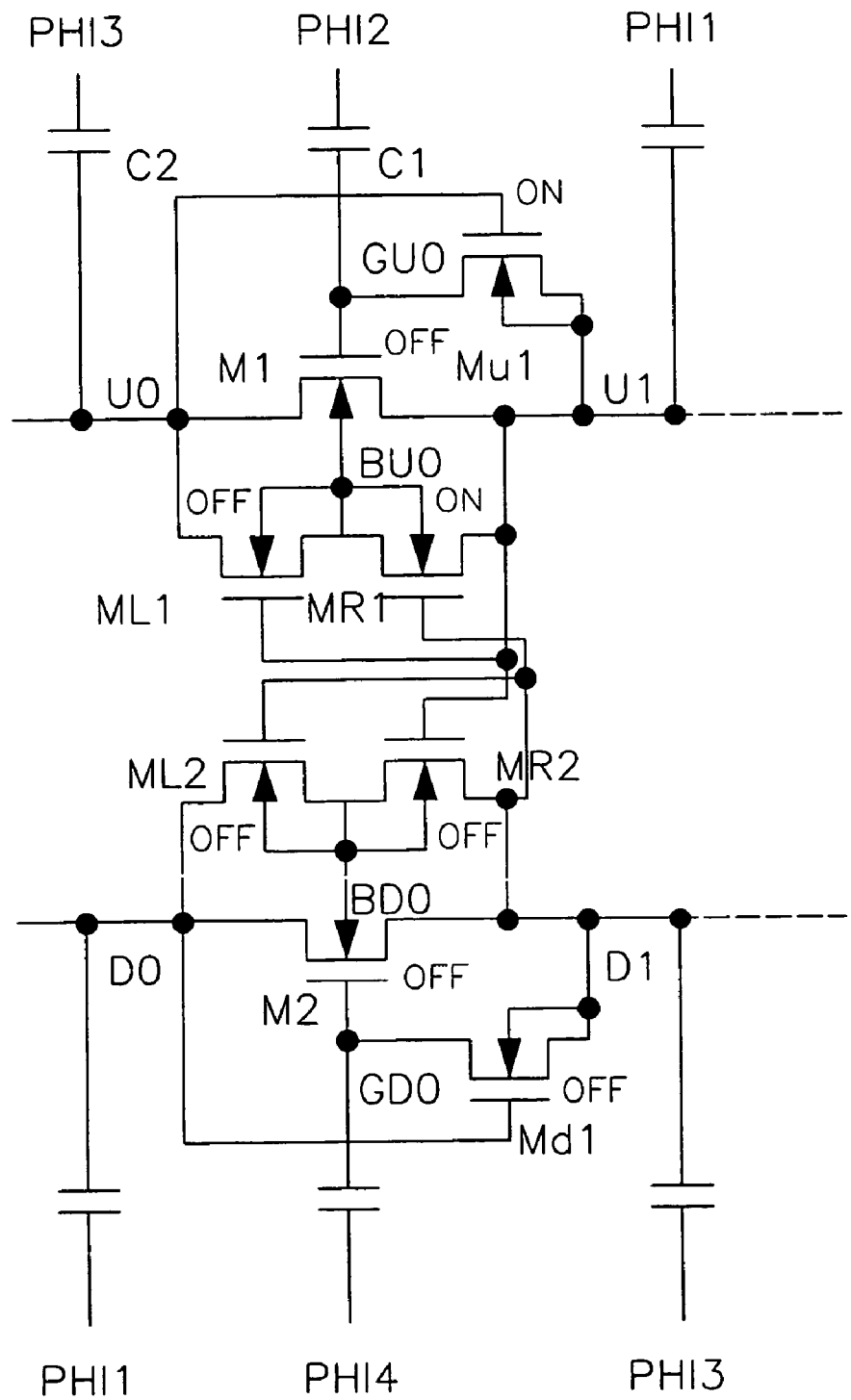

The fifth time slot: with reference to FIG. 3E, the phase clock signal PHI4 becomes a low level signal to turn off the main pass transistor M2.

Figure 3F:
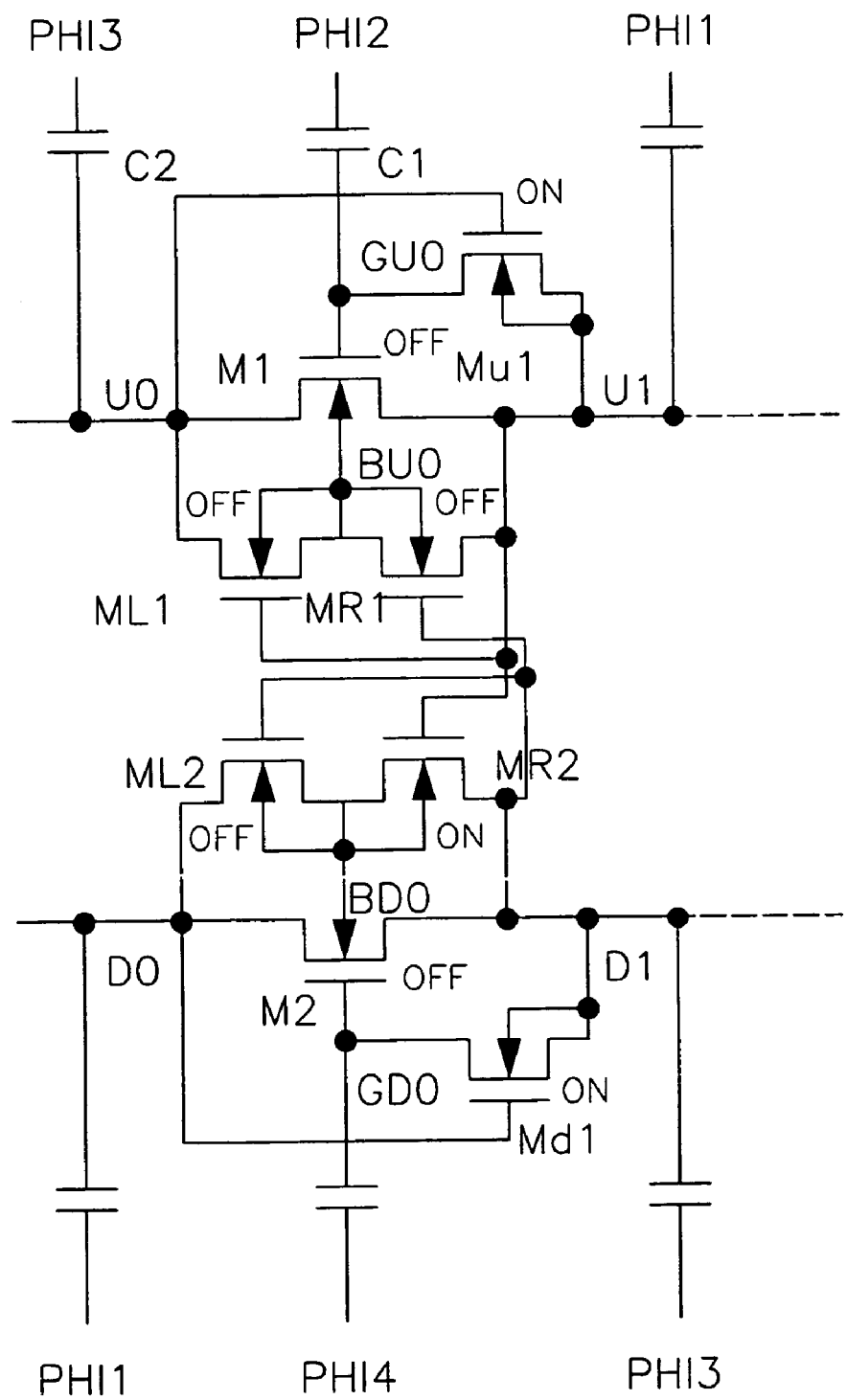

The sixth time slot: with reference to FIG. 3F, the phase clock signal PHI3 becomes a low level signal to turn on the pre-charge transistor Md1. Therefore, a return of the charge current can be avoided and the substrate transistor MR2 is turned on to bias the P-well of the main pass transistor M2 to a low potential level so as to mitigate the body effect.

Figure 3G:
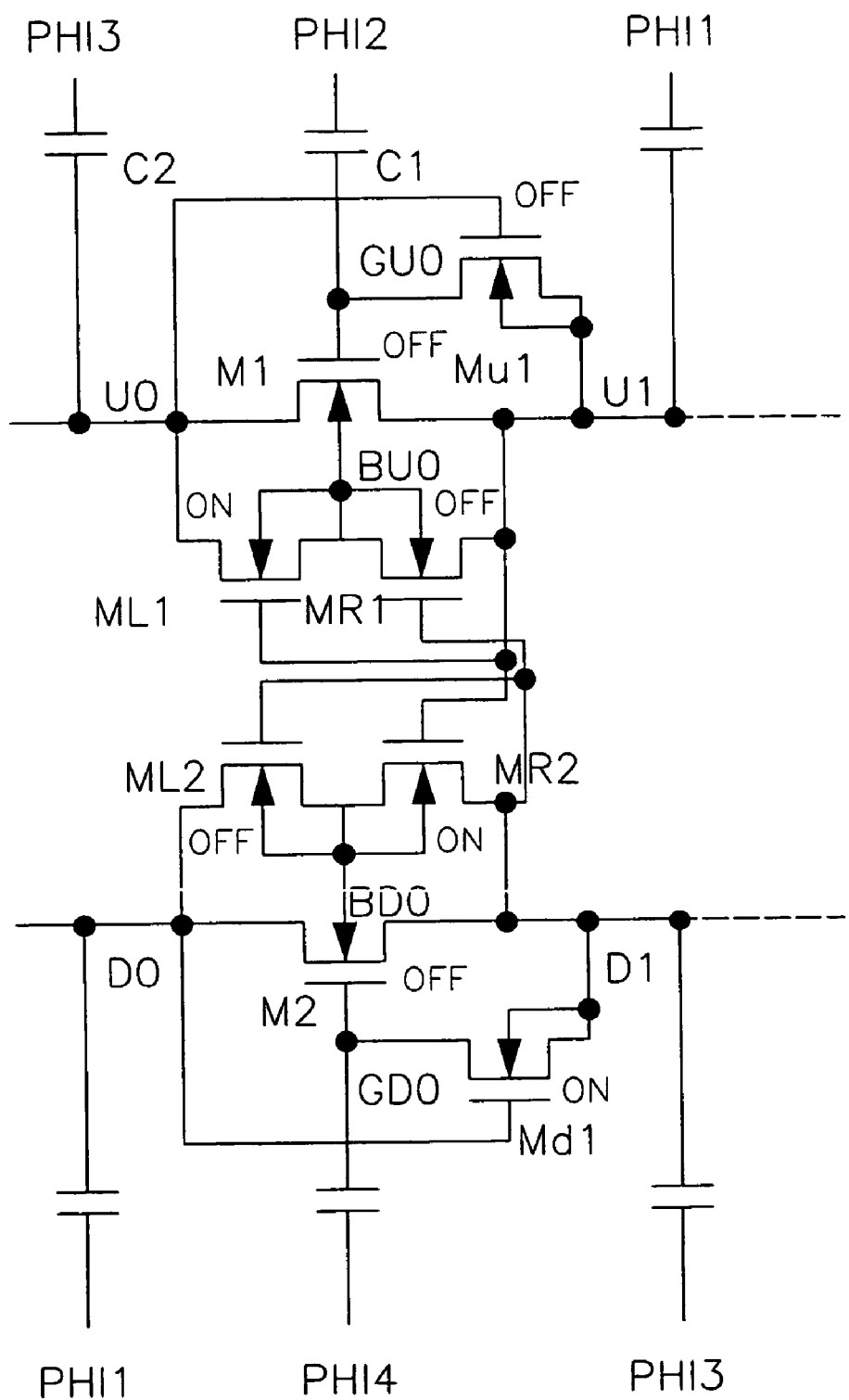

In the seventh and eighth time slots, the upper branch charge pump (31) starts to be operated. As shown in FIG. 3G, representing the seventh time slot, the phase clock signal PHI1 becomes a high level signal, whereby the second node U1 is coupled to the high level. The parasitic bipolar transistor existing at the PN junction of the pre-charge transistor Mu1 is turned on. A forward bias will pre-charge the gate node GU0 of the main pass transistor M1. Meanwhile, the substrate transistor ML1 will be turned on. Before the main pass transistor M1 becomes conducted, the potential level (Vbs) across the body to source of the main pass transistor M1 is zero thus the body effect of the main pass transistor M1 is effectively reduced.

Figure 3H:
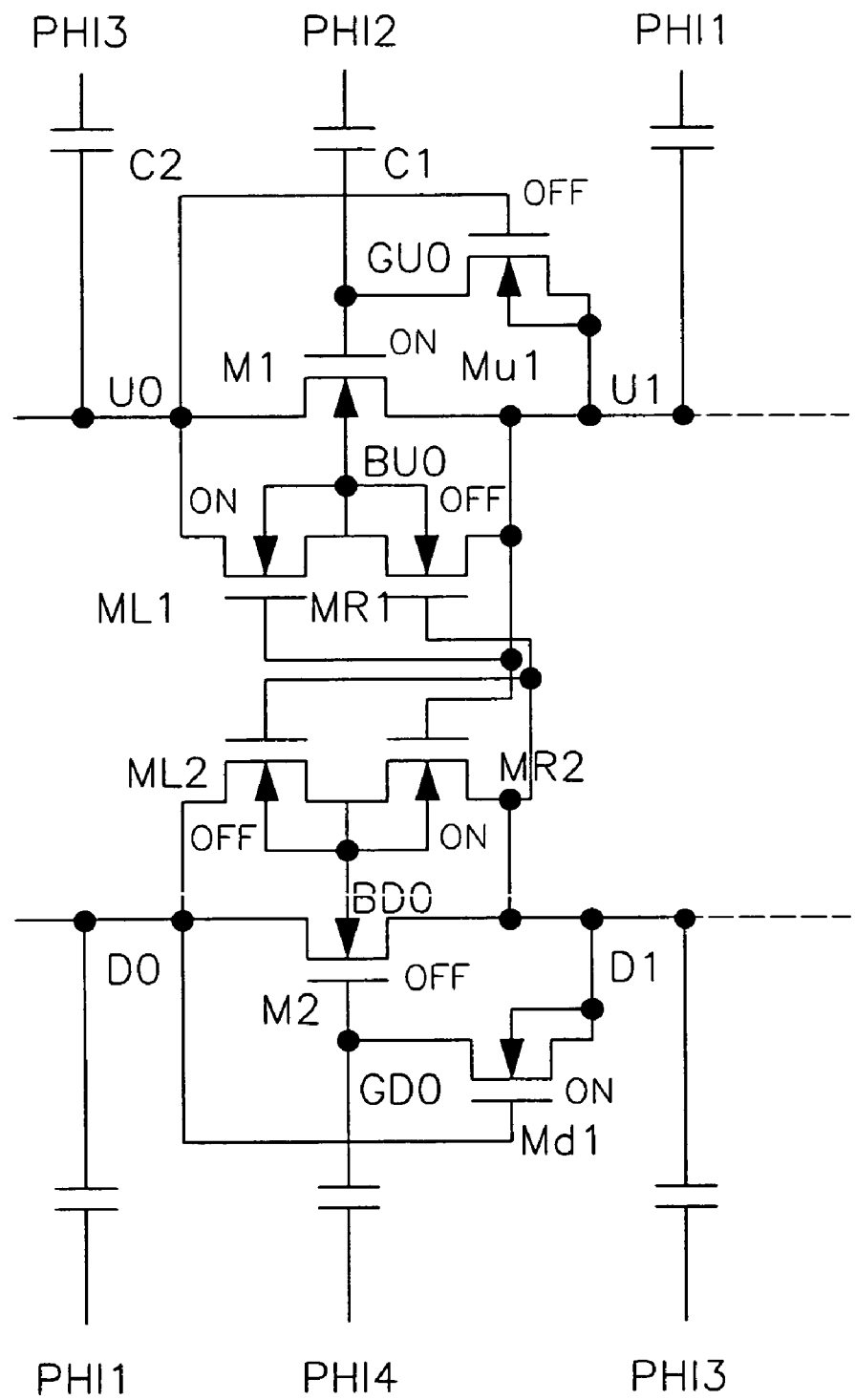

The eighth time slot: With reference to FIG. 3H, the phase clock signal PHI2 becomes a high level signal to turn on the main transistor M1, whereby the charge current is able to pass through the upper branch charge pump to the next boosting stage.

Figure 4:
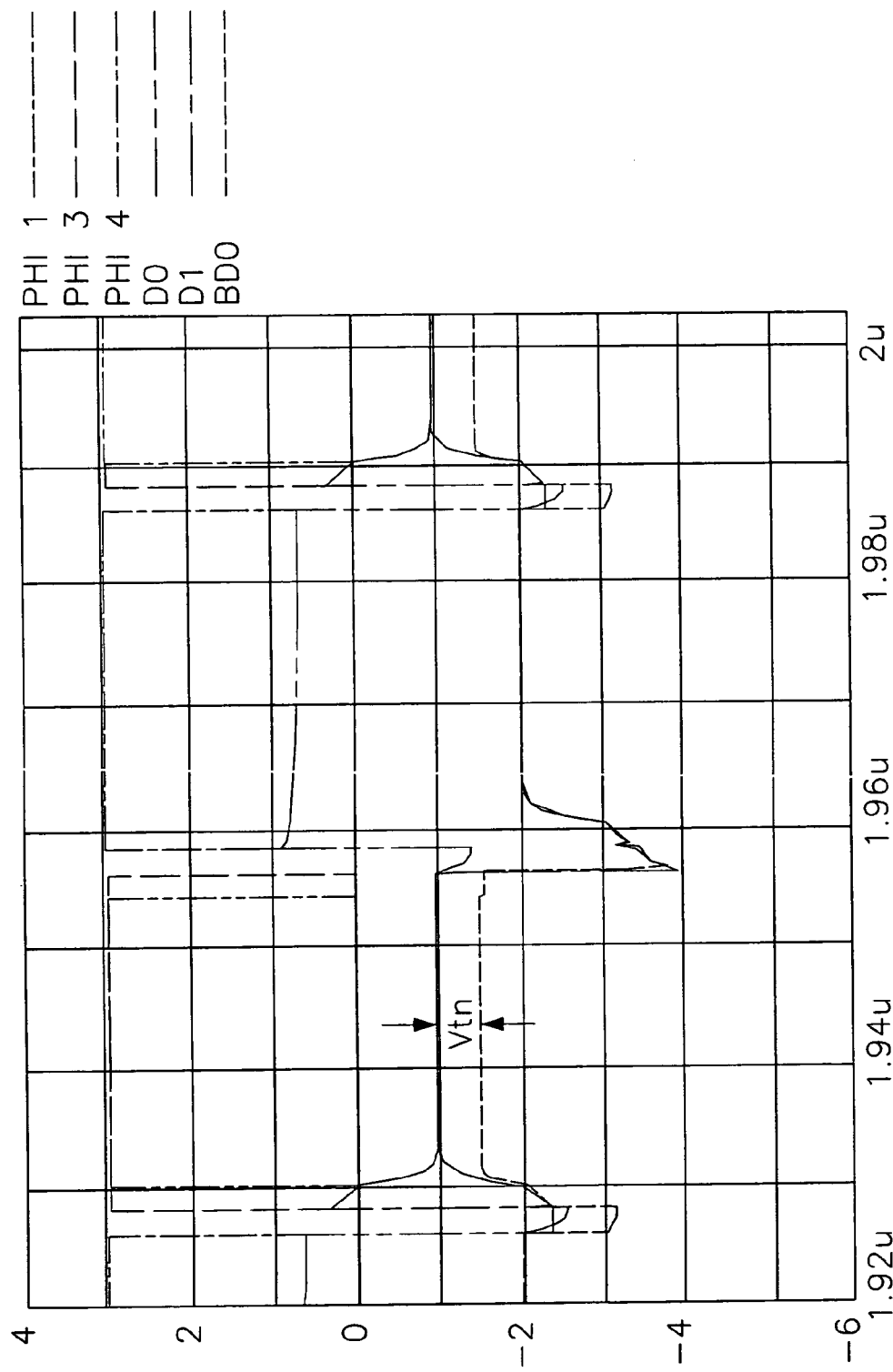
FIG. 4 shows simulated waveforms at different nodes in accordance with the present invention.

With reference to FIG. 4, the simulated waveforms showing the phase clock signals PHI1–PHI4, the first node D0 and the second node D1 of the lower branch charge pump (32), and the body BD0 of the main transistor M2 are respectively illustrated. It is noted that the potential level of the main transistor M2 is kept at a low level to effectively mitigate the body effect. The similar approach described above is suitable for a positive voltage charge pump composed of P-channel transistors.

Figure 5:
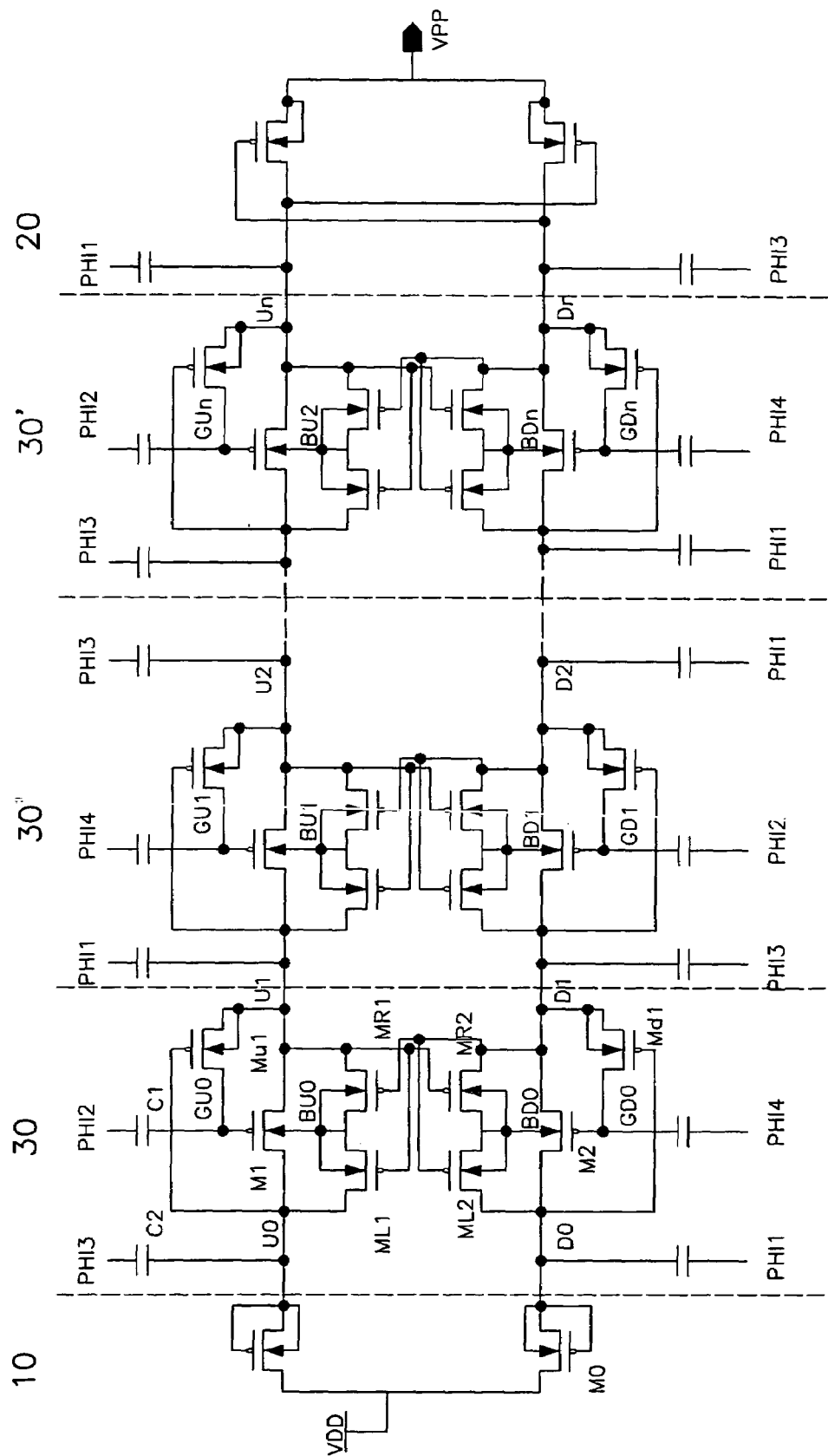
FIG. 5 is a circuit diagram according a second embodiment of the present invention.
Figure 6:
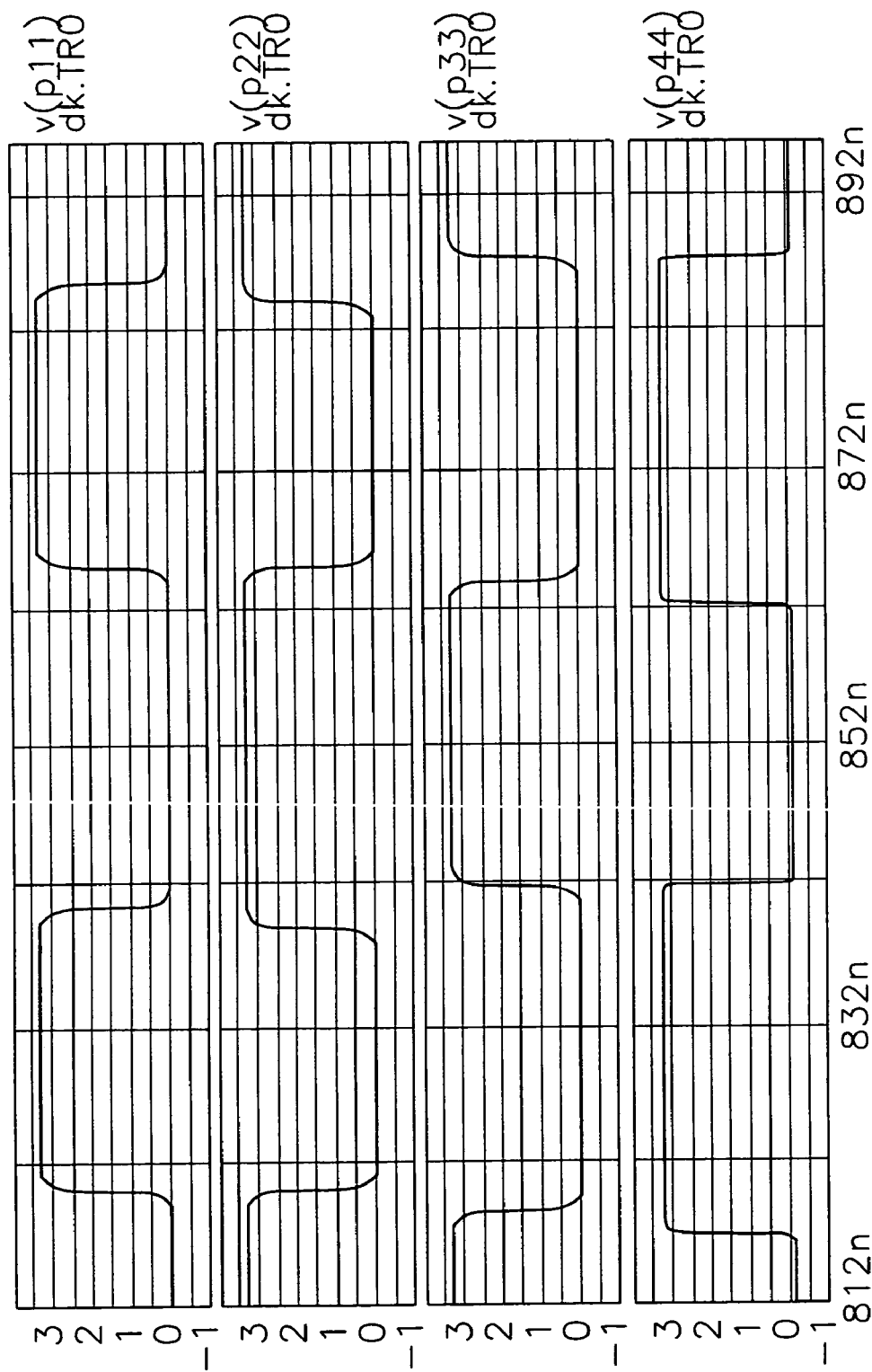
FIG. 6 shows waveforms of four phase clock signals applied for the circuit of FIG. 5 in accordance with the present invention.
Figure 7:
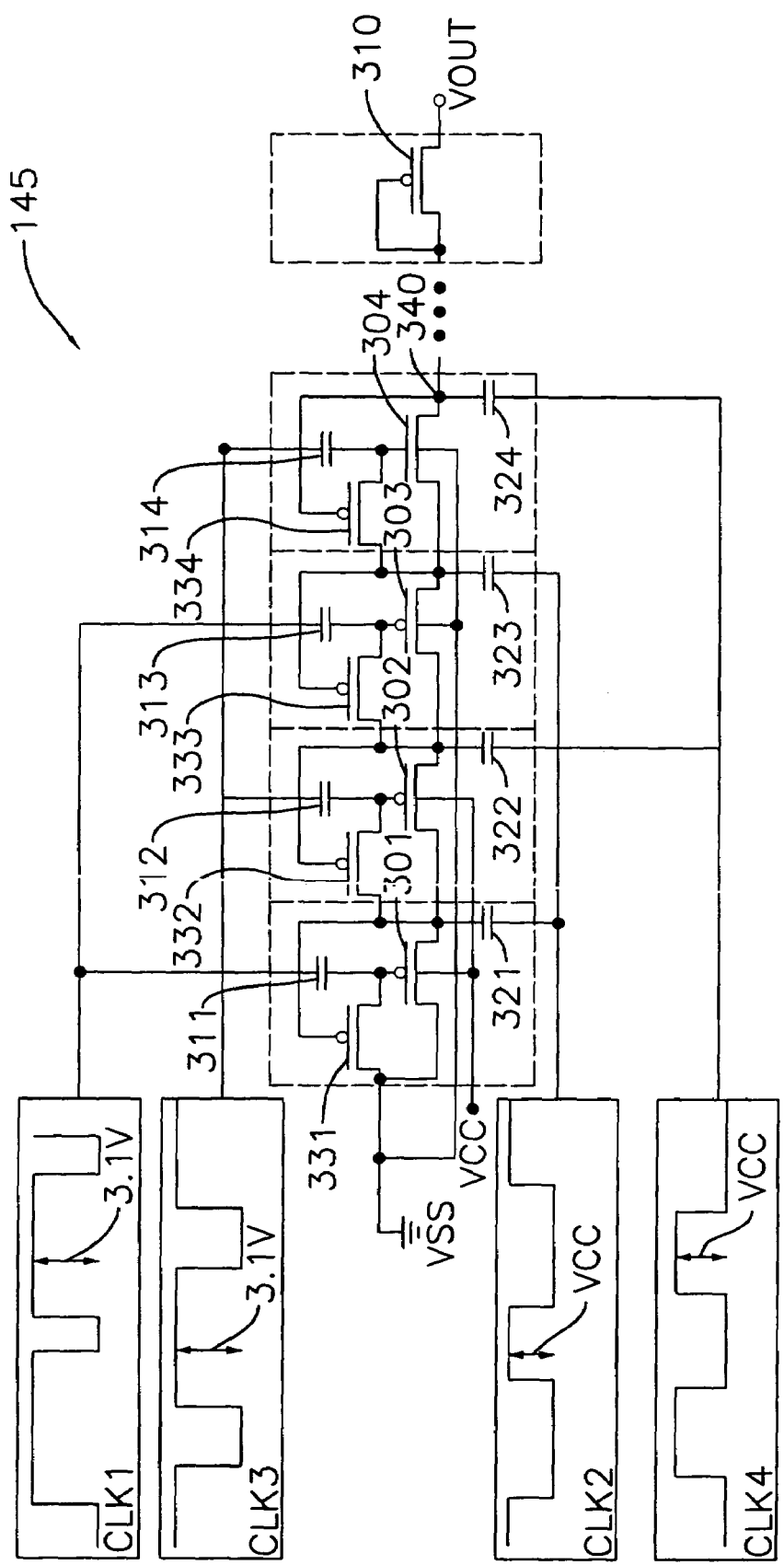
FIG. 7 is a circuit diagram of a conventional negative charge pump circuit.

With reference to FIG. 5, the charge pump circuit is substantially the same as FIG. 1, wherein the difference is that all the N-channel transistors in FIG. 1 are replaced by P-channel transistors to construct a positive voltage charge pump. Further, the current conduction is opposite to the negative charge pump and the input node is connected to Vdd, wherein four phase clock signals to drive the positive voltage charge pump are shown in FIG. 6.

According to the foregoing description, the present invention has the features as following.

1. Mitigating the body effect: the invention provides a boosting stage architecture in which main pass transistors of the upper/lower branch charge pump as well as the substrate transistors are properly driven by phase clock signals so as to keep the potential level of the body of the main pass transistors at a low level thus mitigating the body effect.

2. Pre-charge operation: a pre-charge transistor is provided to couple to the gate terminal of the main transistor, wherein the body and the drain terminals of the pre-charge transistor itself are connected together. When the respective phase clock signal becomes a high level, the parasitic bipolar transistor existing at PN junction of the pre-charge transistor is turned on to pre-charge the coupled main transistor. Without amplifying the phase clock signal, the main transistor still can be directly activated by the phase clock signal.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A four-phase charge pump circuit with reduced body effect comprising:

an input stage;

an output stage, which outputs a boosted voltage; and multiple boosting stages coupled between the input stage and the output stage and driven by four phase clock signals; each boosting stage comprising an upper branch charge pump and a lower branch charge pump, each branch charge pump further comprising:

a main pass transistor having a body, a gate terminal, a source terminal as a first node and a drain terminal as a second node, wherein the first node and the second node connect respectively to a front boosting stage and a rear boosting stage, and potential at the body is kept at a low level by the four phase clock signals;

a pre-charge transistor having a gate terminal, a source terminal and a drain terminal, wherein the drain terminal and the source terminal of the pre-charge transistor are coupled to the gate terminal of the main transistor and the second node; the gate terminal of the pre-charge transistor is coupled to the first node of the main pass transistor;

two capacitors coupled respectively to the gate terminal of the main pass transistor and the first node; and two substrate transistors, each of them having a body, a gate terminal, a source terminal and a drain terminal, wherein the source terminals and the bodies of the substrate transistors are connected together to the body of the main pass transistor, and the drain terminals of the substrate transistors are connected respectively to the first node and the second node of the main pass transistor;

wherein the gate terminal of one substrate transistor, whose drain terminal connects to the first node of the main pass transistor, is connected to the second node of the main pass transistor, and the gate of the other substrate transistor is connected to the second node of the main pass transistor of the other branch charge pump.

2. The charge pump circuit as claimed in claim 1, wherein the charge pump circuit is a negative charge pump circuit and the main pass transistors, the pre-charge transistors, and the substrate transistors are N-channel MOSFETs.

3. The charge pump circuit as claimed in claim 1, wherein the charge pump circuit is a positive charge pump circuit and the main pass transistors, the pre-charge transistors, and the substrate transistors are P-channel MOSFETs.

4. The charge pump circuit as claimed in claim 1, a body and the source terminal of the pre-charge transistor are connected together.

5. The charge pump circuit as claimed in claim 2, a body and the source terminal of the pre-charge transistor are connected together.

6. The charge pump circuit as claimed in claim 3, a body and the source terminal of the pre-charge transistor itself are connected together.

* * * * *